(12) United States Patent
Noma (10) Patent No.: US 7,208,340 B2
(45) Date of Patent: Apr. 24, 2007

(54) SEMICONDUCTOR DEVICE MANUFACTURING METHOD

(75) Inventor: Takashi Noma, Ota (JP)

(73) Assignee: Sanyo Electric Co., Ltd., Osaka (JP)

(*) Notice: Subject to any disclaimer, the term of this patent is extended or adjusted under 35 U.S.C. 154(b) by 61 days.

(21) Appl. No.: 10/733,799

(22) Filed: Dec. 12, 2003

(65) Prior Publication Data

US 2004/0161920 A1 Aug. 19, 2004

(30) Foreign Application Priority Data

Dec. 13, 2002 (JP) .............................. 2002-361683

(51) Int. Cl.
*H01L 21/44* (2006.01)
(52) U.S. Cl. ........................... 438/106; 257/467
(58) Field of Classification Search ................ 438/620, 438/621, 666, 668, 676, 778, 106, 110, 112, 438/113; 257/110, 112, 113, 467, E33.056, 257/E23.001, E21.499, 620, 621, 666, 668, 257/676, 778
See application file for complete search history.

(56) References Cited

U.S. PATENT DOCUMENTS

| | | | |
|---|---|---|---|
| 6,221,751 B1 | 4/2001 | Chen et al. | |
| 6,259,039 B1* | 7/2001 | Chroneos et al. | 174/263 |
| 6,432,744 B1 | 8/2002 | Amador et al. | |
| 6,780,251 B2* | 8/2004 | Tometsuka | 118/725 |
| 6,805,279 B2* | 10/2004 | Lee et al. | 228/220 |
| 2002/0005400 A1 | 1/2002 | Gat | |
| 2002/0158060 A1 | 10/2002 | Uchiyama et al. | |

FOREIGN PATENT DOCUMENTS

| | | |
|---|---|---|
| EP | 0468874 A2 | 1/1992 |
| JP | 62-94925 | 5/1987 |
| JP | 2002-512436 A1 | 4/2002 |
| WO | WO-99/40624 A1 | 8/1999 |
| WO | WO-02/50875 A2 | 6/2002 |
| WO | WO-02/51217 A2 | 6/2002 |

OTHER PUBLICATIONS

A. Badihi. "ShellCase Ultrathin Chip Size Package," Mar. 14, 1999, International Symposium on Advanced Packaging Materials, pp. 236-240.

* cited by examiner

*Primary Examiner*—David Vu
(74) *Attorney, Agent, or Firm*—Morrison & Foerster LLP

(57) ABSTRACT

The invention is directed to improving of a yield and reliability of a BGA type semiconductor device having ball-shaped conductive terminals. A semiconductor wafer having warped portions is supported by a plurality of pins, being spaced from a heated stage. The semiconductor wafer is heated as a whole by uniformly irradiating thermal radiation thereto by using IR heaters disposed on an upper part of the semiconductor wafer and side heaters facing to lateral surfaces of the semiconductor wafer. This enables uniform reflowing of the conductive terminals provided on the semiconductor wafer, and makes each of the conductive terminals form a uniform shape.

10 Claims, 11 Drawing Sheets

SEMICONDUCTOR DEVICE MANUFACTURING METHOD

BACKGROUND OF THE INVENTION

1. Field of the Invention

This invention relates to a BGA (ball grid array) type semiconductor device which has ball-shaped conductive terminals.

2. Description of the Related Art

A CSP (chip size package) receives attention in recent years as a three-dimensional mounting technology as well as a new packaging technology. The CSP is a small package having about the same outside dimensions as those of a semiconductor die.

A BGA type semiconductor device has been known as a kind of CSP. A plurality of ball-shaped conductive terminals made of a metal such as solder is arrayed in a grid pattern on one principal surface of the BGA type semiconductor device and is electrically connected with the semiconductor die mounted on the other side of the package.

When the BGA type semiconductor device is mounted on electronic equipment, the semiconductor die and an external circuit on a printed circuit board are electrically connected by compression bonding of each of the conductive terminals to each of wiring patterns on the printed circuit board.

Such a BGA type semiconductor device has advantages in providing a large number of conductive terminals and in size reduction over other CSP type semiconductor devices such as an SOP (small outline package) and a QFP (quad flat package), which have lead pins protruding from their sides. The BGA type semiconductor device can be used, for example, as an image sensor chip for a digital camera incorporated into a mobile telephone.

Figure 10A:
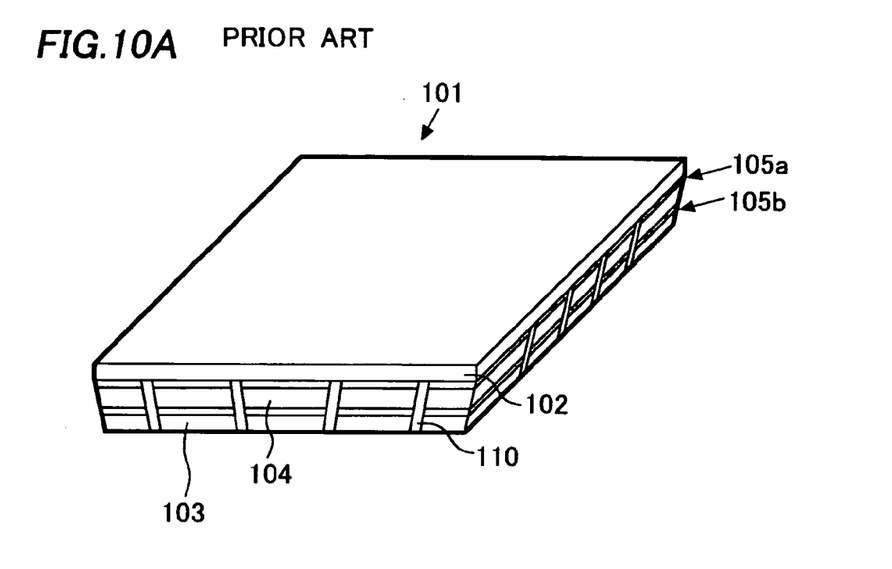
FIGS. 10A and 10B are perspective views showing a semiconductor device of the conventional art.
Figure 10B:
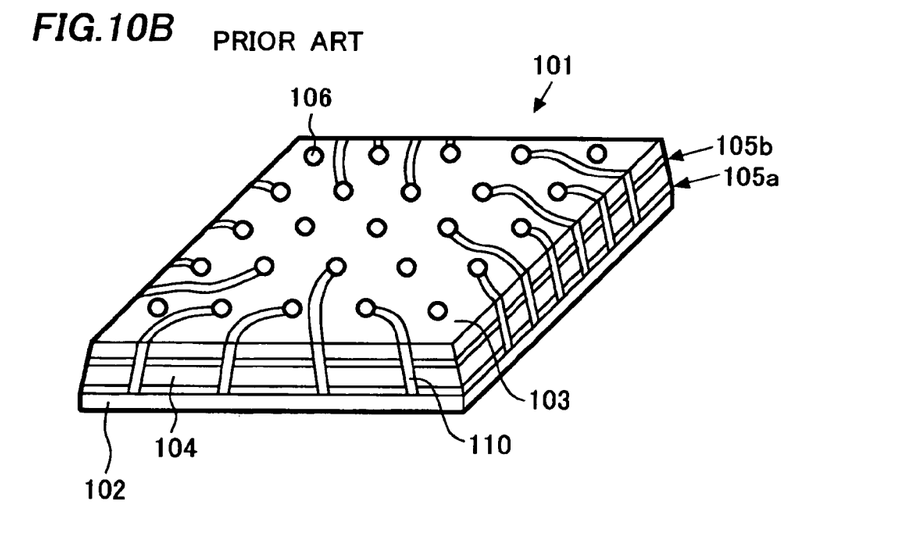

FIGS. 10A and 10B show an outline structure of a conventional BGA type semiconductor device. FIG. 10A is an oblique perspective figure of a front side of the BGA type semiconductor device. FIG. 10B is an oblique perspective figure of a back side of the BGA type semiconductor device.

A semiconductor die 104 is sealed between a first glass substrate 102 and a second glass substrate 103 through epoxy resins 105a and 105b in the BGA type semiconductor device 101. A plurality of ball-shaped terminals 106 is arrayed in a grid pattern on a principal surface of the second glass substrate 103, that is, on the back side of the BGA type semiconductor device 101. The conductive terminals 106 are connected to the semiconductor die 104 through second wirings 110. The second wirings 110 are connected with aluminum wirings pulled out from inside of the semiconductor die 104, making each of the ball-shaped terminals 106 electrically connected with the semiconductor die 104.

Figure 11:
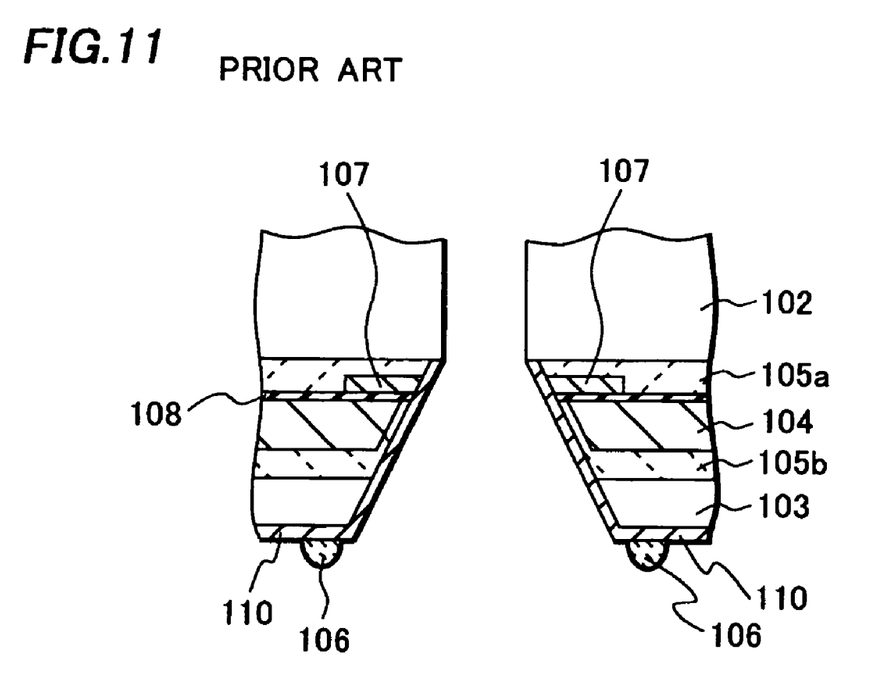
FIG. 11 is a cross-sectional view showing a manufacturing method of the semiconductor device of the conventional art.

Detailed explanation on a cross-sectional structure of the BGA type semiconductor device 101 will be given referring to FIG. 11. FIG. 11 shows a cross-sectional view of the BGA type semiconductor devices 101 divided along dicing lines into individual dice.

A first wiring 107 is provided on an insulation film 108 provided on a surface of the semiconductor die 104. The semiconductor die 104 is bonded on the first glass substrate 102 with the resin 105a. A back side of the semiconductor die 104 is bonded on the second glass substrate 103 with the resin 105b.

One end of the first wiring 107 is connected to the second wiring 110. The second wiring 110 extends from the end of the first wiring 107 to a surface of the second glass substrate 103. And the ball-shaped conductive terminal 106 is formed on the second wiring 110 extending onto the second glass substrate 103.

Figure 12A:
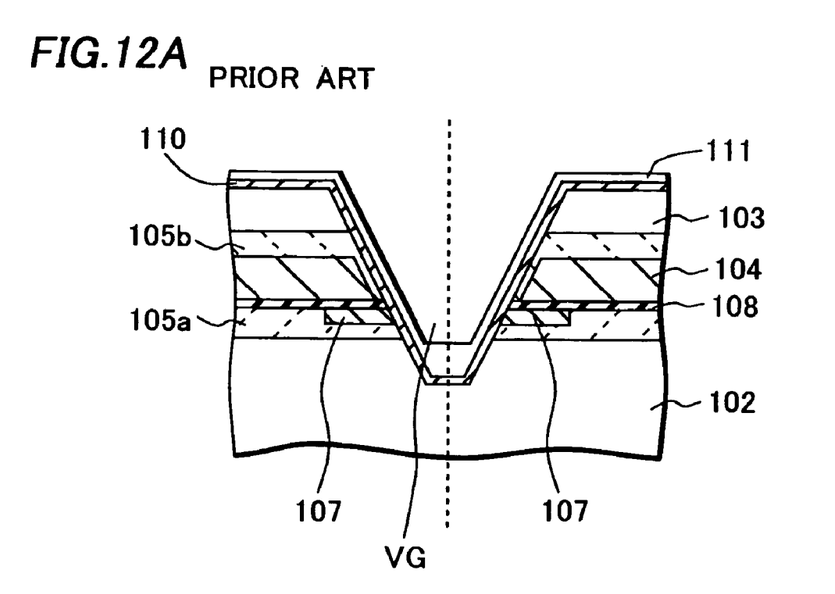
FIGS. 12A and 12B are cross-sectional views showing the manufacturing method of the semiconductor device of the conventional art.

The described BGA type semiconductor device 101 having a V-shaped groove VG is formed with a protection film 111 on its surface by using an organic resin before the described dicing process (FIG. 12A). For forming the protection film 111 on a surface of the second wiring 110, a method in which the organic resin is dropped from above on the back surface of the semiconductor die 104, which is placed upward, and the protection film 111 is formed by utilizing centrifugal force generated by rotating the semiconductor wafer itself, has been employed.

Figure 12B:
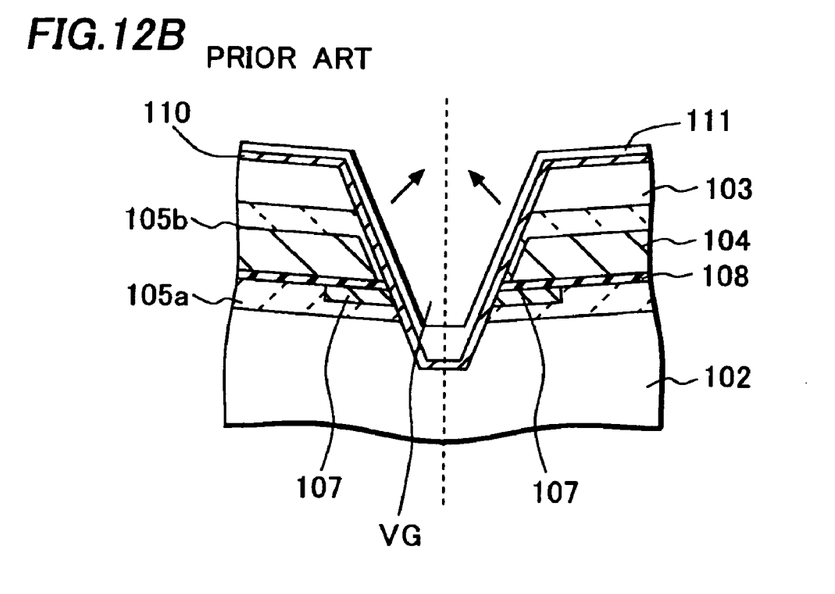

However, in this method, the organic resin having a thermosetting property is over-deposited and thickened more than required on a bottom of the V-shaped groove VG at a dicing line (broken line in FIG. 12A) as shown in FIG. 12A. This is because that the organic resin is pasty and of adhesive characters. Therefore, when the protection film 111 is thermally set by baking, the organic resin deposited in the V-shaped groove VG shrinks more than organic resin covering other parts of the semiconductor device 101. This causes the organic resin in the V-shaped groove VG to shrink largely, thereby warping a semiconductor wafer which is to be divided into semiconductor dice afterward (warp it in a direction shown by an arrow in FIG. 12B).

Such a warped semiconductor wafer causes a problem in the subsequent manufacturing process. Particularly, in a reflow process (high heat treatment) of conductive terminals 106 (so-called bump electrode) made of a conductive material having thermal fluidity such as solder, the semiconductor wafer can not be uniformly heated overall, thereby lowering reliability.

Figure 13:
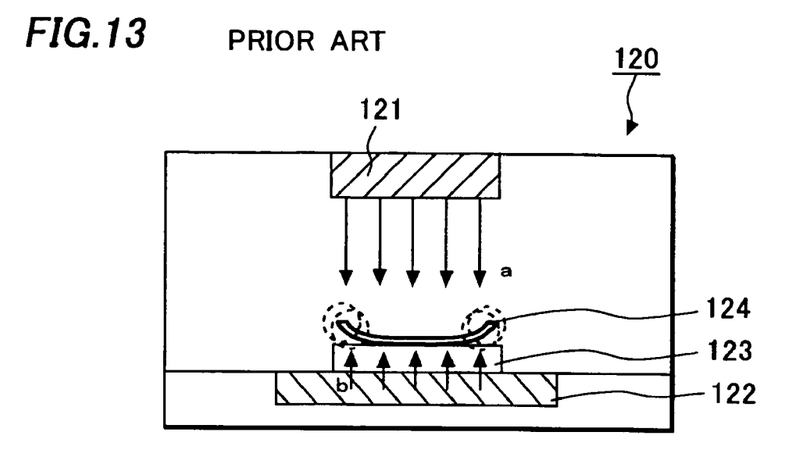
FIG. 13 is a cross-sectional view showing a heating configuration of a reflow device of the semiconductor device of the conventional art.
Figure 14:
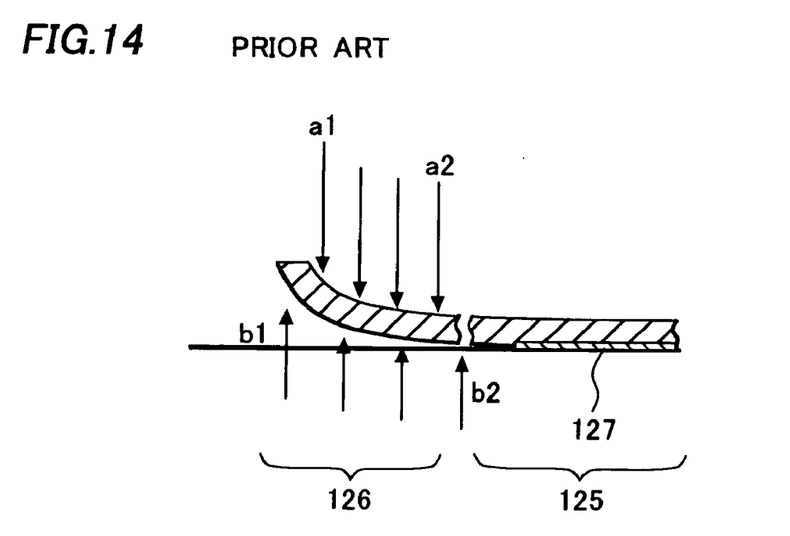
FIG. 14 is an enlarged cross-sectional view of the reflow device of the semiconductor device of the conventional art.

For example, when reflowing the conductive terminals 106 as shown in FIG. 13, the warped semiconductor wafer 124 is mounted on a stage 123 in a reflow device 120. The reflow device 120 is kept at a predetermined temperature by thermal radiation "a" emitted downward from IR (infrared) heaters 121 provided on a ceiling and thermal radiation "b" emitted upward from hot plates 122 provided under the stage 123. Arrows in FIG. 13 show a schematic view of the thermal radiation "a" and the thermal radiation "b". Broken line circles in FIG. 13 show warped portions formed at ends of the semiconductor wafer 124. FIG. 14 is an enlarged view of one of the portions enclosed in the broken line circles.

As shown in FIG. 14, the semiconductor wafer 124 has a flat portion (hereafter, referred to as a flat portion 125), and a warped portion at an end of the semiconductor wafer 124 (hereafter, referred to as a warped portion 126). The flat portion 125 is in direct contact with the lower stage 123 (hereafter, referred to as a direct contact portion 127). On the other hand, the warped portion 126 is not in contact with the stage 123 since it is warped.

If the conductive terminals 106 are reflowed in this state, the direct contact portion 127 is heated to higher temperature than required by the hot plates 122.

On the contrary, the warped portion 126 is radiated with thermal radiation "a1" and thermal radiation "a2" from the IR heaters disposed thereabove. The thermal radiation a1 heats the end of the semiconductor wafer 124 and the thermal radiation a2 heats the inside thereof. Since there is a difference in intensity between the thermal radiation "a1" and "a2", it is difficult to heat the semiconductor wafer 124 uniformly. Furthermore, there is another difference in intensity between thermal radiation "b1" and "b2". The thermal radiation b1 is radiated to a lower part of the end of the semiconductor wafer 124 and the thermal radiation b2 is radiated to a lower part close to the flat portion 125 of the semiconductor wafer 124.

Therefore, a temperature difference develops between the warped portion 126 and the flat portion 125 in the semiconductor wafer 124.

Thus, the temperature difference depending on positions in the semiconductor wafer 124 makes it difficult to form the conductive terminals 106 of a uniform shape on the semiconductor wafer 124. As a result, a yield and reliability of the semiconductor device are markedly reduced.

The invention is directed to overcoming the disadvantage that the warped semiconductor wafer formed in a manufacturing process of the BGA type semiconductor device affects the reflow process of the conductive terminals.

SUMMARY OF THE INVENTION

The invention provides a semiconductor device manufacturing method which includes providing a semiconductor wafer provided with a plurality of metal portions on a surface of the semiconductor wafer, suspending the semiconductor wafer in a reflow furnace, reflowing the metal portions on the surface of the semiconductor wafer suspended in the reflow furnace so that the metal portions form conductive terminals using first heaters disposed in the reflow furnace and facing the surface of the semiconductor wafer.

The invention also provides a semiconductor device manufacturing method which includes providing a semiconductor wafer provided with a pair of first wirings on a front surface of the semiconductor wafer, attaching a first supporting substrate to the front surface of the semiconductor wafer, attaching a second supporting substrate to a back surface of the semiconductor wafer, partially exposing the first wirings by forming a groove through the semiconductor wafer, forming second wirings connected to exposed portions of the first wirings and extending to a surface of the second supporting substrate, forming a plurality of metal portions on the second wirings, supporting the semiconductor wafer using a plurality of pins that are in contact with the first supporting substrate, and reflowing the metal portions so as to from conductive terminals using first heaters disposed facing the back surface of the semiconductor wafer while the semiconductor wafer is supported by the pins.

DETAILED DESCRIPTION OF THE INVENTION

A manufacturing method of a semiconductor device of the invention will be described with reference to FIGS. 1 to 9.

Figure 1:
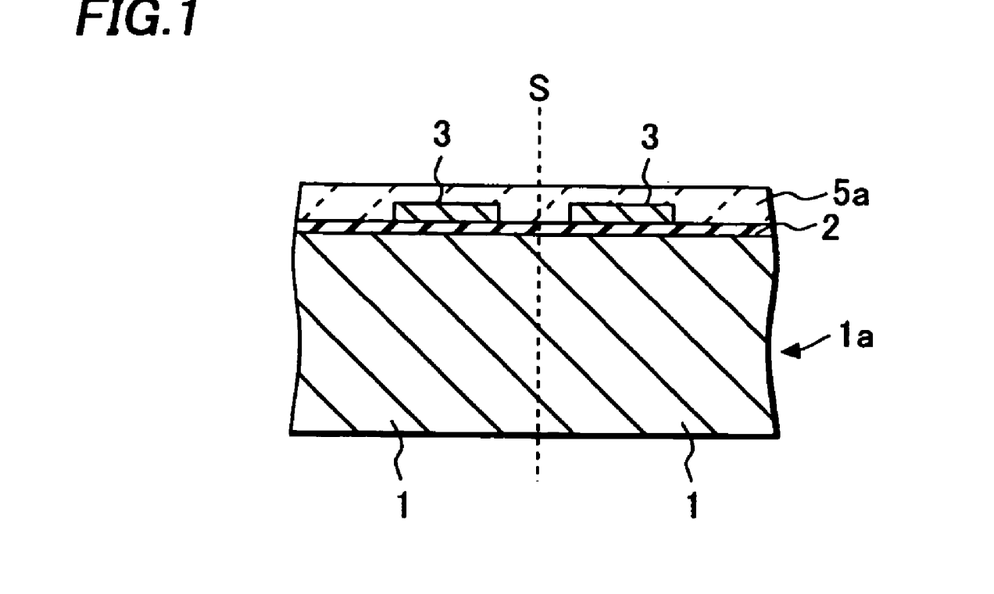
FIG. 1 is a cross-sectional view showing a step of a manufacturing method of a semiconductor device of an embodiment of the invention.

As shown in FIG. 1, a semiconductor wafer 1a is prepared. The semiconductor wafer 1a is to be divided into a plurality of semiconductor dice 1 along a border S (called a dicing line or a scribe line). Each of these semiconductor dice 1 is, for example, for image sensor of a CCD and formed by a wafer process of a semiconductor. An insulation film 2 is formed on the semiconductor wafer 1a and a pair of first wiring layers 3 is formed on the insulation film 2. The pair of the first wiring layers 3 is formed by a method in which a metal is sputtered to form a metal layer on the whole surface and the metal layer is selectively etched. The pair of the first wiring layers 3 is approximately 1 micrometer in thickness.

The pair of the wiring layers 3 is formed respectively on each sides of the border S facing each other.

The pair of the first wiring layers 3 is pads extending from a bonding pad of the semiconductor die 1 to the border S. That is, the pair of the first wiring layers 3 is externally connected pads and electrically connected to a circuit of the semiconductor die 1 (not shown).

Figure 2:
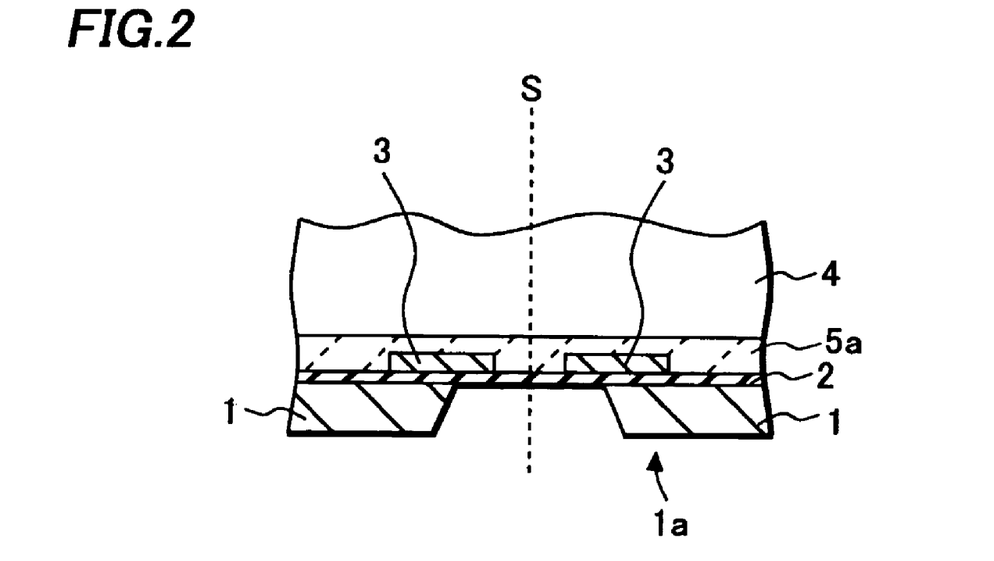
FIG. 2 is a cross-sectional view showing a processing step following the step of FIG. 1.

Next, as shown in FIG. 2, a first glass substrate 4(as a first supporting substrate) having a thickness of about 200 micrometers is attached to a front surface of the semiconductor wafer "1a" having the first wiring layers 3 with a resin layer 5a made of a transparent epoxy material used as an adhesive. Then, a back surface of the semiconductor wafer 1a is grinded to make the semiconductor dice thin, i.e., approximately at 100 micrometers in die thickness, and dry-etched along the border S to partially expose the insulation layer 2. By this dry-etching the semiconductor wafer 1a is separated into the semiconductor dice 1, but these semiconductor dice 1 are supported by the first glass substrate 4 and still form a sheet of the semiconductor wafers 1a as a whole.

Figure 3:
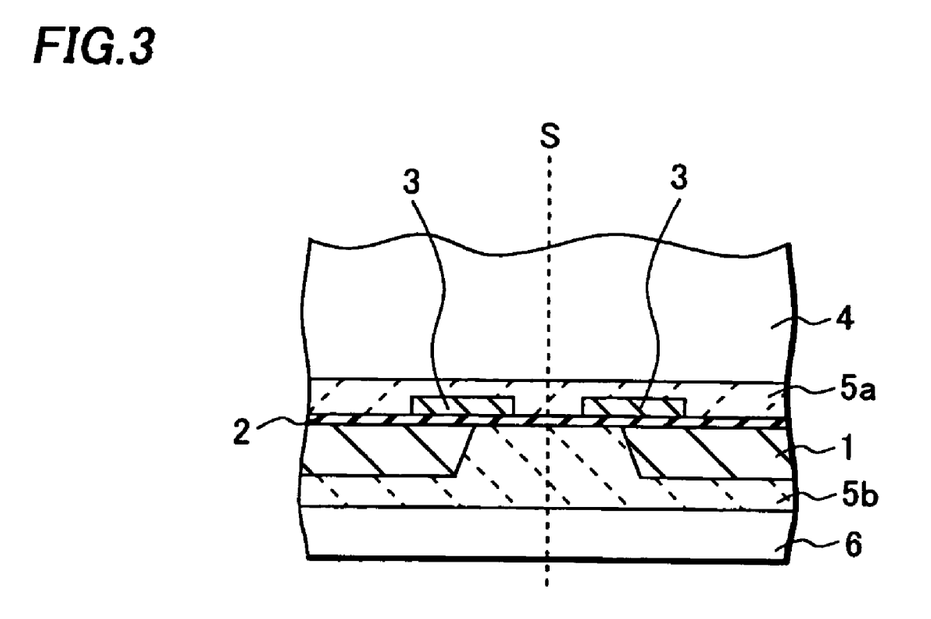
FIG. 3 is a cross-sectional view showing a processing step following the step of FIG. 2.

As shown in FIG. 3, a second glass substrate 6 (as a second supporting substrate) having a thickness of about 100 micrometers is attached to the back surface of the semiconductor dice 1 with the resin layer 5b used as an adhesive. Alternatively, this second glass substrate 6 may be not attached. The material of the first and the second supporting substrate can be some material other than glass.

Figure 4A:
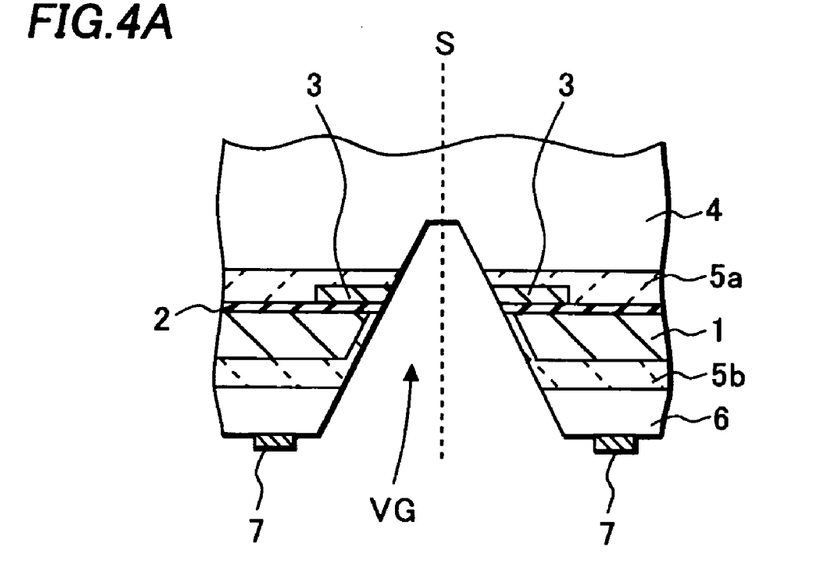
FIGS. 4A and 4B are cross-sectional views showing processing steps following the step of FIG. 3.

As shown in FIG. 4A, cushions 7 made of a photosensitive organic film having elasticity are formed in predetermined positions on a flat portion of the second glass substrate 6. The cushions 7 absorb pressure applied to conductive terminals 9 which will be described below and prevent breaking of the glass substrate etc. If the second glass substrate 6 is not attached to the back surface of the semiconductor dice 1, the cushions 7 are formed on the back of the semiconductor dice 1.

After then, notching is performed along the border S from the back surface of the semiconductor dice 1. The notching is cutting by using tools like a saw, for example, a blade, from the back surface of the semiconductor dice 1. The notching is performed from the second glass substrate 6 to the first glass substrate 4 to an extent that the first glass substrate 4 is slightly cut, exposing lateral surfaces of the first wiring layers 3. By this notching, a V-shaped groove VG is formed along the border S. Since the exposed surface can be contaminated by the notching at this time, preferably the exposed surface is cleansed by dry-etching etc as appropriate.

Figure 4B:
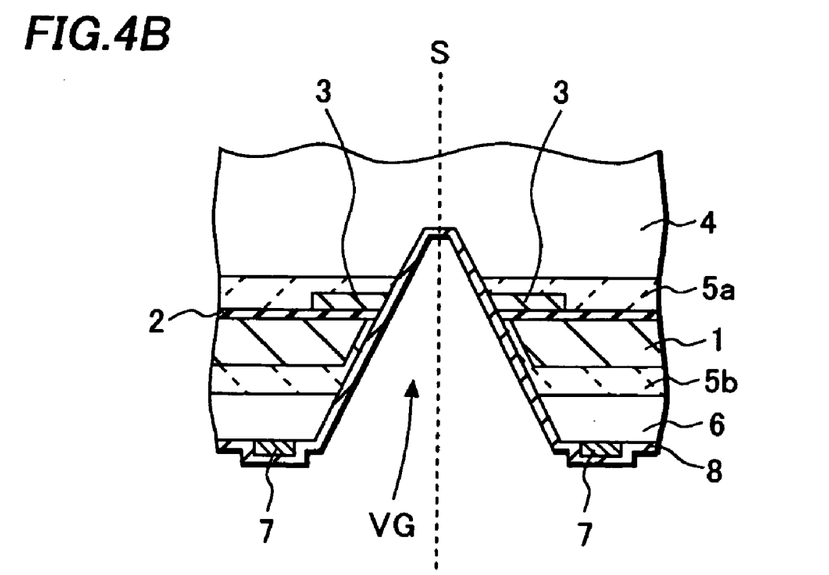

As shown in FIG. 4B, an aluminum layer having a thickness of approximately 3 micrometers is formed by sputtering such that it covers the second glass substrate 6 and the V-shaped groove VG formed by notching. Then, this aluminum layer is patterned to provide a predetermined wiring pattern to form second wiring layers 8 electrically connected to the exposed lateral surfaces of the first wiring layer 3. The second wiring layers 8 extend to surfaces of the second glass substrates 6 provided on the back surfaces of the semiconductor dice 1. On the second wiring layers 8 extending to the surfaces of the second glass substrates 6, the conductive terminals 9 which will be described below are formed. If the second glass substrate 6 is not attached to the back surfaces of the semiconductor dice 1, the second wiring layers 8 extend to the back surfaces of the semiconductor dice 1.

Figure 5:
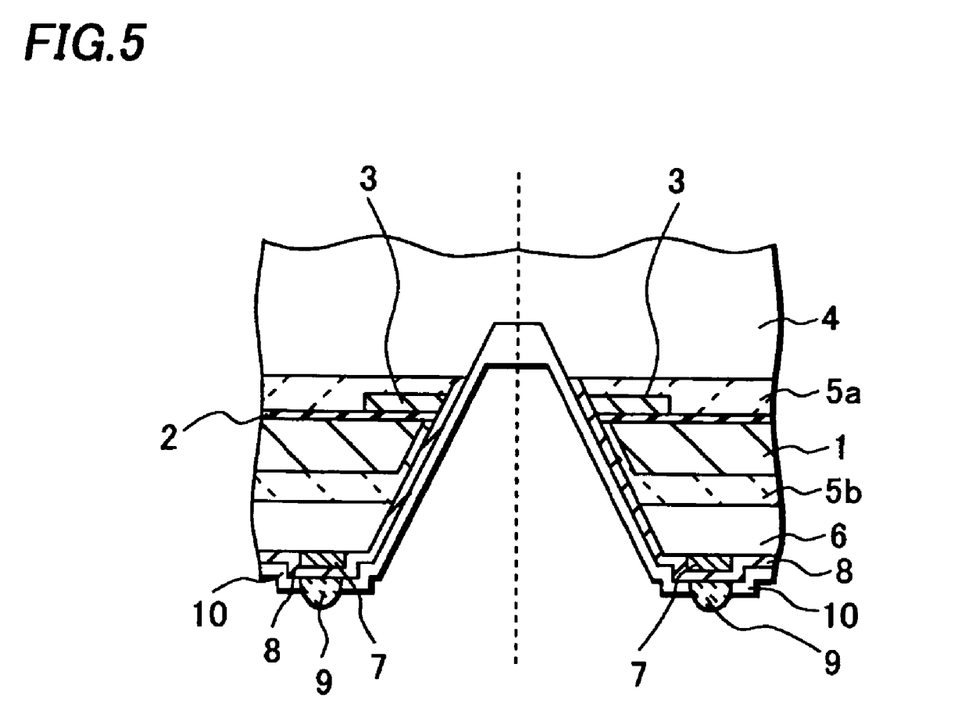
FIG. 5 is a cross-sectional view showing a processing step following the step of FIG. 4B.

As shown in FIG. 5, a protection film 10 is formed on the second wiring layers 8. The protection layer 10 functions as a solder mask in a following screen printing process. The protection film 10 is formed by a method in which a thermosetting organic resin is dropped on the back surface of the semiconductor dice 1, which is placed upward, from above, and the semiconductor wafer 1a is rotated to form the protection film 10 on the second wiring layers 8 by utilizing centrifugal force. This is the same process as the process shown in FIG. 12A of the conventional art. Alternatively, the protection film 10 can be formed of a resist material.

Then, the protection film 10 is thermally set by baking. The baking makes the semiconductor wafer warped at its end portions.

Next, openings are formed in the protection film 10 to expose the second wiring layers 8 so that conductive terminals 9, which will be described below can be formed in predetermined positions of the protection film 10 above the second glass substrates 6. The openings are formed in positions corresponding to the cushions 7 if the cushions 7 are formed. Then, the conductive terminals 9 made of a material having thermal fluidity, for example, solder are formed in the screen printing process, and goes on to a next reflow process.

The reflow process will be described with reference to FIGS. 6A to 8. The conductive terminals 9 are fluidized by performing a high heat treatment in the reflow process described below. This process is for forming the ball-shaped conductive terminals 9 by utilizing its surface tension.

Figure 6A:
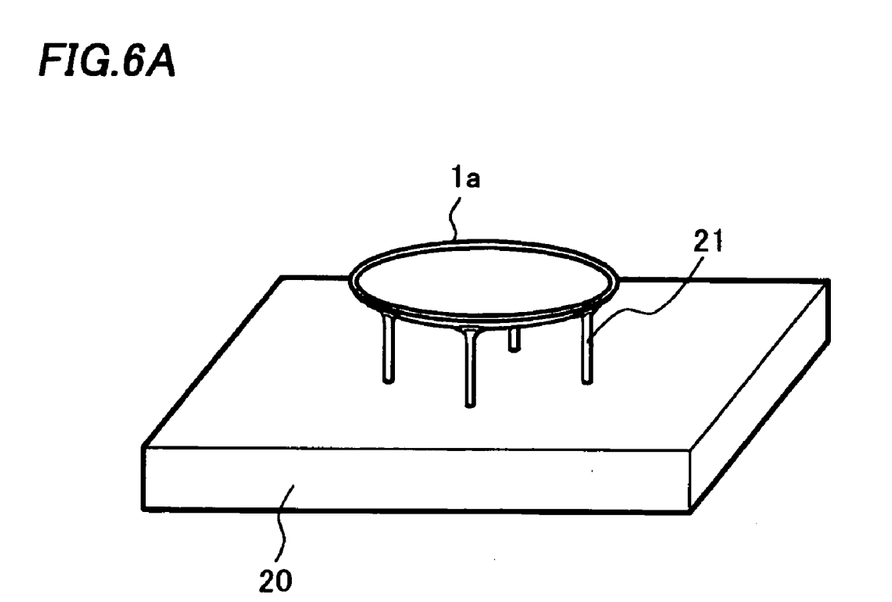
FIGS. 6A and 6B are a perspective view and a side view of a reflow device of the embodiment.
Figure 6B:
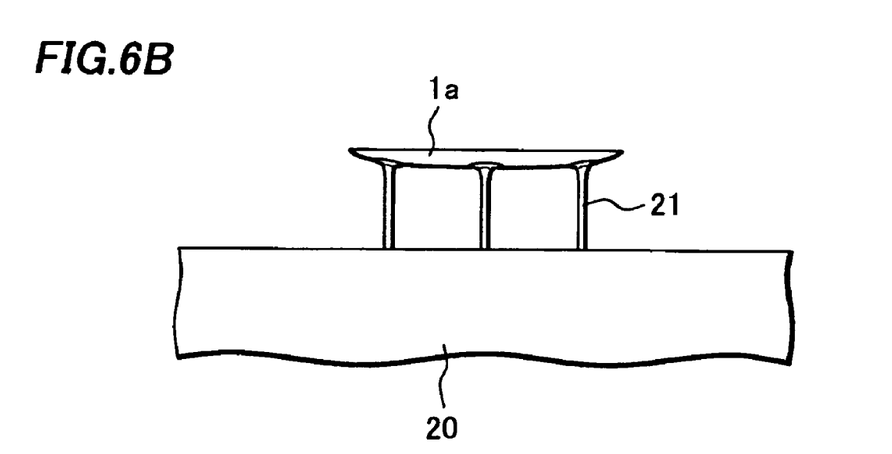

As shown in FIGS. 6A and 6B, a stage 20 is prepared and a plurality of pins 21 stands on the stage 20. The semiconductor wafer 1a is mounted on ends of the pins 21, its front surface being connected to the ends of the pins 21. Those pins 21 have the same length and support the semiconductor wafer 1a along its edge. FIG. 6A is a perspective view of that state, and FIG. 6B is a front view thereof.

Accordingly, the semiconductor wafer 1a is spaced from the stage 20 by a length of the pins 21, and the heat radiated from the stage 20 is prevented from being applied directly to the semiconductor wafer 1a. The length of the pins 21 is appropriately 1 mm.

Figure 7A:
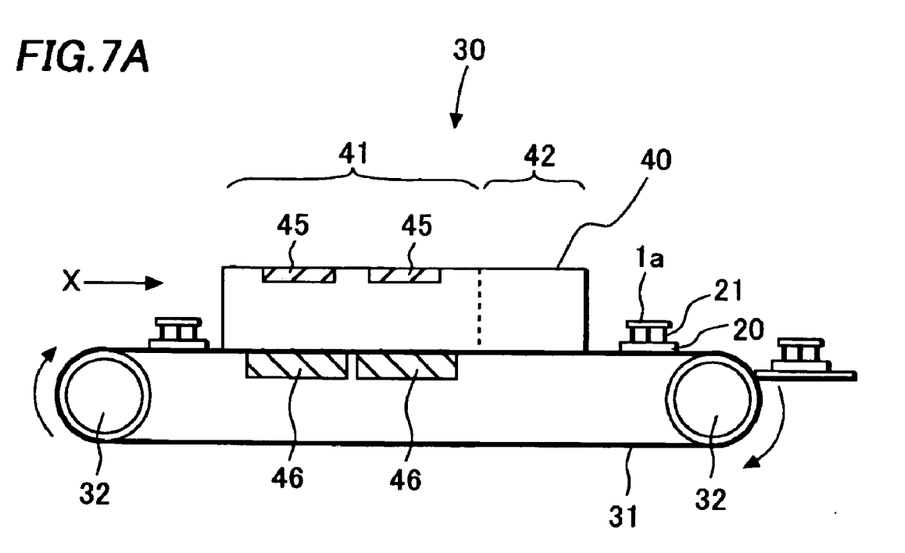
FIGS. 7A and 7B are side views of the reflow device of the embodiment.

As shown in FIG. 7A, the stage 20 mounted with the semiconductor wafer 1a shown in FIGS. 6A and 6B is conveyed inside a reflow processing box 40 of a reflow device 30. A rotating belt 31 is provided under the reflow processing box 40 and a pair of pulleys 32 is provided to rotate the rotating belt 31. The stage 20 having the semiconductor wafer 1a thereon is mounted on the belt 31. By driving the pulleys 32, the stage 20 with the semiconductor wafer 1a is conveyed inside the reflow processing box 40 with the rotating belt 31.

Figure 7B:
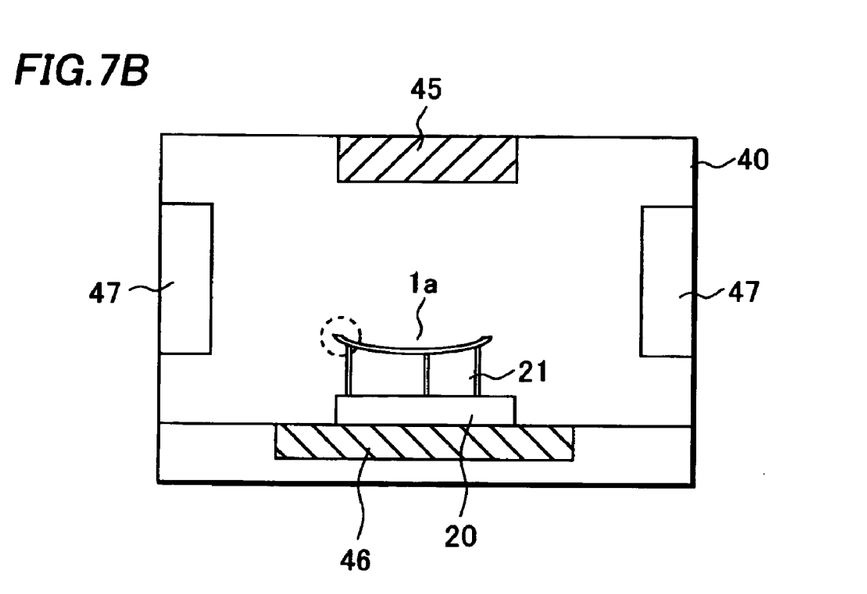

The reflow processing box 40 has a heating zone 41 and a cooling zone 42. A plurality of IR heaters 45 is provided on a ceiling of the heating zone 41. A plurality of hot plates 46 is provided under the belt 31. FIG. 7B is a side view of FIG. 7A seen from the direction of arrow X and an enlarged view of an inside of the reflow processing box 40. As shown in FIG. 7B, a plurality of side heaters 47 is provided on both inner lateral surfaces of the reflow processing box 40. The side heaters 47 face to lateral surfaces of the semiconductor wafer 1a. The cooling zone 42 is for cooling the semiconductor wafer 1a heated in the heating zone 41, and not provided with the IR heaters 45, the hot plates 46, and the side heaters 47.

Although an example that the semiconductor wafer 1a is conveyed integrally with the plurality of the pins 21 is disclosed, alternatively the pins 21 can be set in the heating zone 41 in advance. In this case, when the semiconductor wafer 1a is conveyed from the outside of the reflow processing box 40 and positioned on the pins 21, the pins 21 rise up to raise the semiconductor wafer 1a up. The semiconductor wafer 1a is heated being raised by the pins 21 in the heating zone 41. Then, the pins 21 descend so that the semiconductor wafer 1a is separated from the pins 21 to be conveyed to the cooling zone 42.

Next, the reflow process using the reflow device 30 will be described. As shown in FIGS. 7A and 7B, the semiconductor wafer 1a mounted on the stage 20 through the pins 21 is mounted on the belt 31 and conveyed inside the reflow processing box 40 from the side of an arrow X shown in FIG. 7A. The semiconductor wafer 1a is heated from three directions by three kinds of heaters, i.e., the IR heaters 45 provided on the ceiling, the hot plates 46 provided under the belt 31, and the side heaters 47, in the heating zone 41 of the reflow processing box 40. The stage 20 conveyed on the belt 31 is heated by the hot plates 46 provided under the belt 31. It takes the stage 20 approximately 1 minute to pass through the heating zone 41, and heating temperature is approximately 220° C.

After passing through the heating zone 41, the semiconductor wafer 1a is cooled in the cooling zone 42. A cooling device, for example, an air cooling device can be positively provided in the cooling zone 42. The semiconductor wafer 1a is conveyed outside of the reflow processing box 40 and goes on to a dicing process.

Figure 8:
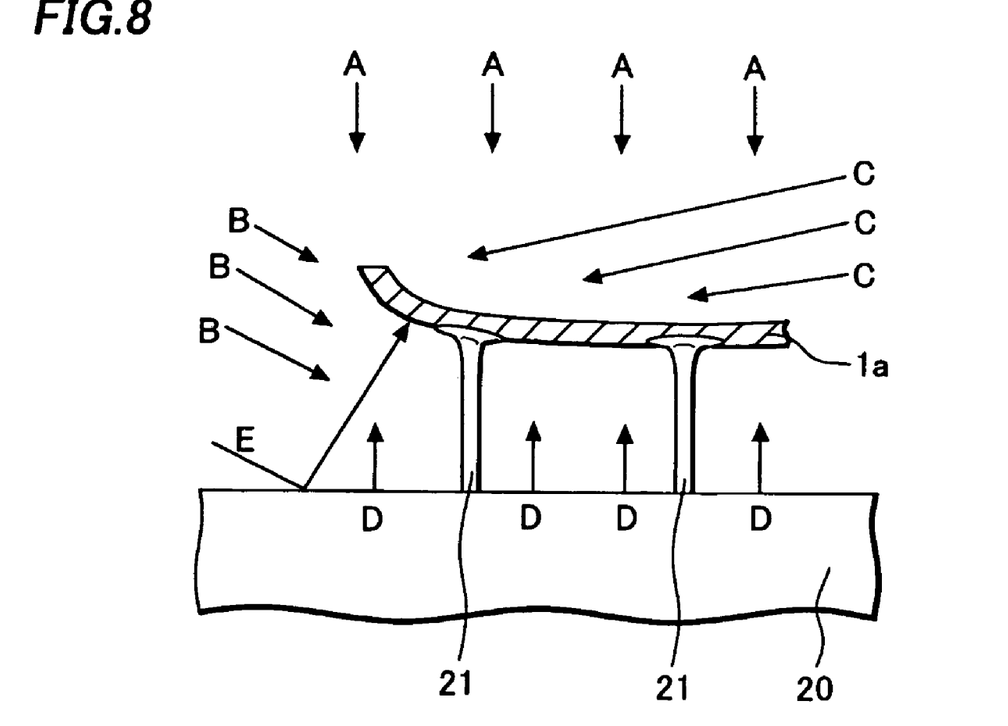
FIG. 8 is a view showing a heating configuration by the reflow device of FIGS. 7A and 7B.

FIG. 8 is an enlarged view of a portion (a warped end of the semiconductor wafer 1a) enclosed in a broken line circle in FIG. 7B. Arrows in FIG. 8 schematically indicates a heating state of the semiconductor wafer 1a by the three kinds of heaters.

As shown in FIG. 8, the end of the semiconductor wafer 1a is radiated with thermal radiation A, B, C, D, and E in the heating zone 41. The thermal radiation A is radiated from the IR heaters set on an upper part of the box 40, the thermal radiation B and C is radiated from the side heaters 47, and the thermal radiation D is radiated from the stage 20 heated by the hot plates 46. The thermal radiation E is generated by reflection of thermal radiation radiated from the side heaters 47 by the stage 20 or the belt 31.

In the embodiment, the side heaters 47 are provided on the both inner lateral surfaces of the reflow processing box 40, so that front surfaces of the warped portions of the semiconductor wafer 1a is heated by the thermal radiation C (by the side heaters 47 on a right side of the FIG. 7B). Similarly, the back surface of the semiconductor wafer 1a is heated by the thermal radiation B (by the side heaters 47 on a left side of FIG. 7B) and the thermal radiation D (by the hot plates 46 on a lower side of FIG. 7B). Back surfaces of the warped portions of the semiconductor wafer 1a is heated by the thermal radiation E which is the thermal radiation B radiated from the side heaters 47 on a left side of FIG. 7B and reflected by the stage 20. Although it is conventionally difficult to heat the warped portions to the same extent as that for the flat portion of the semiconductor wafer 1a, this thermal radiation scheme solves this problem.

Thus, in this embodiment of the invention, since the semiconductor wafer 1a is spaced from the stage 20 resulting in an uniform thermal radiation to the whole surface of the semiconductor wafer 1a, the semiconductor wafer 1a can be heated to the uniform temperature as a whole. Therefore, reflowing of the conductive terminals 9 which are formed on the whole surface of the semiconductor wafer 1a can be uniformly performed, so that the conductive terminals 9 can be formed into the same shape.

Figure 9:
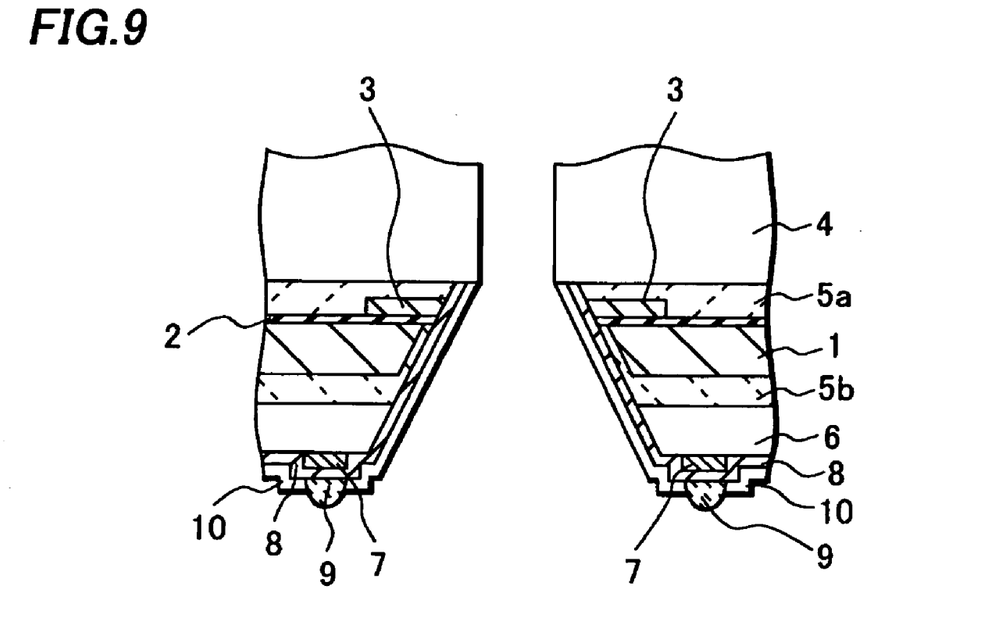
FIG. 9 is a cross-sectional view showing a processing step following the step of FIG. 7A.

After reflowing of the conductive terminals 9, dicing is performed along the border S as shown in FIG. 9, and the semiconductor wafer 1a is divided into a plurality of the semiconductor dice 1. Thus, the BGA type semiconductor device is completed.

In the embodiment of the invention, in the reflowing (high heat treatment) after the conductive terminals 9 are formed by screen printing, the semiconductor wafer 1a is heated being supported by the plurality of the pins 21 disposed on the stage 20 of the reflow device 30. By this method, the semiconductor wafer 1a can be uniformly heated since the semiconductor wafer 1a is not directly heated by the hot plates 46 provided under the stage 20.

Furthermore, the side heaters 47 are disposed on the both inner lateral surfaces of the reflow processing box 40 of the reflow device 30 so that the front surface and the back surface of the warped portions of the semiconductor wafer 1a can be heated uniformly.

What is claimed is:

1. A semiconductor device manufacturing method, comprising:
   providing a semiconductor wafer provided with a plurality of metal portions on a surface of the semiconductor wafer;
   suspending the semiconductor wafer on a plurality of pins in a reflow furnace so that the metal portions are positioned upwardly in the reflow furnace;
   reflowing the metal portions on the surface of the semiconductor wafer suspended in the reflow furnace so that the metal portions form conductive terminals using a first heater disposed in the reflow furnace and facing the surface of the semiconductor wafer.

2. The semiconductor device manufacturing method of claim 1, wherein the pins are mounted on a stage that is heated by a heating plate disposed under the stage.

3. The semiconductor device manufacturing method of claim 1, wherein the semiconductor wafer is heated by a second heater disposed so as to face a lateral edge of the semiconductor wafer.

4. The semiconductor device manufacturing method of claim 1, further comprising removing the semiconductor wafer from the pins after the reflow of the metal portions.

5. A semiconductor device manufacturing method, comprising:
   providing a semiconductor wafer provided with a pair of first wirings on a front surface of the semiconductor wafer;
   attaching a first supporting substrate to the front surface of the semiconductor wafer;
   attaching a second supporting substrate to a back surface of the semiconductor wafer;
   partially exposing the first wirings by forming a groove through the semiconductor wafer;
   forming second wirings connected to exposed portions of the first wirings and extending to a surface of the second supporting substrate;
   forming a plurality of metal portions on the second wirings;
   supporting the semiconductor wafer using a plurality of pins that are in contact with the first supporting substrate; and
   reflowing the metal portions so as to from conductive terminals using a first heater disposed to face the back surface of the semiconductor wafer while the semiconductor wafer is supported by the pins.

6. The semiconductor device manufacturing method of claim 5, wherein the pins are mounted on a stage that is heated by heating plates disposed underneath the stage.

7. The semiconductor device manufacturing method of claim 5, wherein the semiconductor wafer is heated by a second heater disposed so as to face a lateral edge of the semiconductor wafer.

8. A semiconductor device manufacturing method, comprising:
   preparing a semiconductor wafer provided with a pair of first wirings on a front surface of the semiconductor wafer;
   attaching a supporting substrate to the front surface of the semiconductor wafer;
   partially exposing the first wirings by forming a groove from a back surface of the semiconductor wafer;
   forming second wirings connected to exposed portions of the first wirings and extending to the back surface of the semiconductor wafer;
   forming a plurality of metal portions on the second wirings,
   supporting the semiconductor wafer using a plurality of pins that are in contact with the supporting substrate; and
   reflowing the metal portions so as to from conductive terminals using a first heater disposed to face the back surface of the semiconductor wafer while the semiconductor wafer is supported by the pins.

9. The semiconductor device manufacturing method of claim 8, wherein the pins are mounted on a stage that is heated by heating plates disposed underneath the stage.

10. The semiconductor device manufacturing method of claim 8, wherein the semiconductor wafer is heated by a second heater disposed so as to face a lateral edge of the semiconductor wafer.

* * * * *